United States Patent

Frei

[15] 3,701,148

[45] Oct. 24, 1972

[54] ANALOG TO DIGITAL CONVERTER

[72] Inventor: Armin H. Frei, Ruschlikon, Zurich, Switzerland

[73] Assignee: International Business Machines Corporation, Armonk, N.Y.

[22] Filed: Nov. 24, 1971

[21] Appl. No.: 202,034

Related U.S. Application Data

[63] Continuation of Ser. No. 817,760, April 21, 1969, abandoned.

[30] Foreign Application Priority Data

June 20, 1968 Switzerland...............9192/68

[52] U.S. Cl. ...........................340/347 AD, 340/172

[51] Int. Cl.......H03k 13/06, H03k 13/17, H041 3/00

[58] Field of Search..............................340/347, 172

[56] References Cited

UNITED STATES PATENTS 3,100,298 8/1963 Fluhr .................340/347 AD 3,188,624 6/1965 McMillian..........340/347 AD 3,142,056 7/1964 Martin et al. .......340/347 AD

*Primary Examiner*—Daryl W. Cook

*Assistant Examiner*—Thomas J. Sloyan

*Attorney*—Hanifin and Jancin

[57] ABSTRACT

This disclosure provides an analog to digital converter comprising $n$ tunnel diode measuring circuits connected at regular intervals to a transmission line. One end of the line is tied to a gate circuit which samples analog voltages under control of a clock signal; the other end of the line is terminated in its characteristic impedance. The measuring circuits are connected in accordance with their ordinal numbers to n measuring transmission lines supplying calibrated measuring pulses derived by a pulse generator from the clock signal. In each measuring line, a short circuiting switch is inserted after the first connection of the line to a respective measuring circuit, each switch being connected for control to the digital output of the corresponding measuring circuit.

7 Claims, 3 Drawing Figures

INVENTOR
ARMIN H. FREI

BY Bernard N. Wiener
ATTORNEY

ANALOG TO DIGITAL CONVERTER

This is a continuation, of application Ser. No. 817,760 filed Apr. 21, 1969.

BACKGROUND OF THE INVENTION

The invention relates generally to an analog to digital converter for iterative computation of binary values from analog voltage pulses, and it relates more specifically to an analog to digital converter in which an analog signal is compared with a plurality of pulses of scaled values.

Analog representation is a natural mode for evaluating any technological process. However, processing of such values to the best advantage occurs very often in digital form. Possible uses for analog to digital conversion are unlimited. These converters may be found anywhere in electronics, particularly when the data obtained need not be used immediately. Analog to digital converters are needed in growing numbers in process control, information processing and communication engineering. This is a result of the advantages obtained from transmitting, processing and storing data in digital form.

The prior art analog to digital converters operate in accordance with the following principle. Analog values are sampled at specific time intervals and stored. The stored sampling values are then evaluated repeatedly, e.g., by comparison with reference values, to obtain the proper digital values. The digital data may be used directly or after buffering. High operation speed is desirable for analog wide-band applications as the measuring steps have to be applied to each sample.

Each of the prior art operational steps has been performed by many different devices. It is known from experience that active elements, e.g., amplifiers, impedance converters, feedback circuits, have substantially limited the operating speed of prior art analog to digital converters. Therefore, it is important that active elements be minimized to obtain high operating speed and it is desirable that the fastest available active devices be used. Simultaneously, it must be determined if the available conversion procedure is suitable for high speed operation. The fewer the steps which are linked to make up the analog to digital conversion, the better does the procedure work at high speed.

Similarly, the quality of the results obtained is dependent on the kind and the number of circuit elements used. Use of simple circuits with a minimun number of active elements will tend to insure high precision operation. In this manner undesired time delays canGG be avoided and loss of quality, e.g., due to pulse overshoot, can be minimized. Many prior art analog to digital converter circuits have the disadvantages mentioned. Primarily, the principles of their operation use the linking of a significant number of steps which is unsuited for high operational speed or they exhibit relatively low accuracy.

OBJECT OF THE INVENTION

It is an object of this invention to provide an analog to digital converter adapted to handle a considerable flow of information in a manner which obtains high operating speed.

It is a further object of this invention to provide an analog to digital converter with desirable operating speed by the use of suitable circuit elements to obtain wide band operation for conversion of microwave signals.

It is another object of this invention to utilize suitable high speed operating conditions to attain high resolution capacity and excellent stability with quality of conversion which will comply with severest demands.

It is furthermore an object of this invention to provide a digital to analog converter circuit which is suitable for integrated circuit manufacturing with optimal characteristics and lowest cost.

SUMMARY OF THE INVENTION

The objects of this invention are realized by an analog to digital converter with the following characteristics:

a. There are $n$ measuring circuits which correspond to $n$ binary digit positions to produce digital outputs, with each analog pulse being applied to them sequentially.

b. There are $n$ measuring lines which apply measuring pulses to the measuring circuits. The measuring circuits are connected in accordance with their ordinal number to the first, to the first and second, to the first, second and third measuring lines, etc.

The method of operation of the present analog to digital converter is characterized by: calibrated measuring pulses being conveyed to each of the measuring lines; and the arrival of the measuring and analog pulses at the measuring points being synchronized with each other.

The foregoing and other objects, features, and advantages of the invention will be apparent from the following more particular description of the preferred embodiment of the invention, as illustrated in the accompanying drawings.

EMBODIMENT OF THE INVENTION

Figure 1:
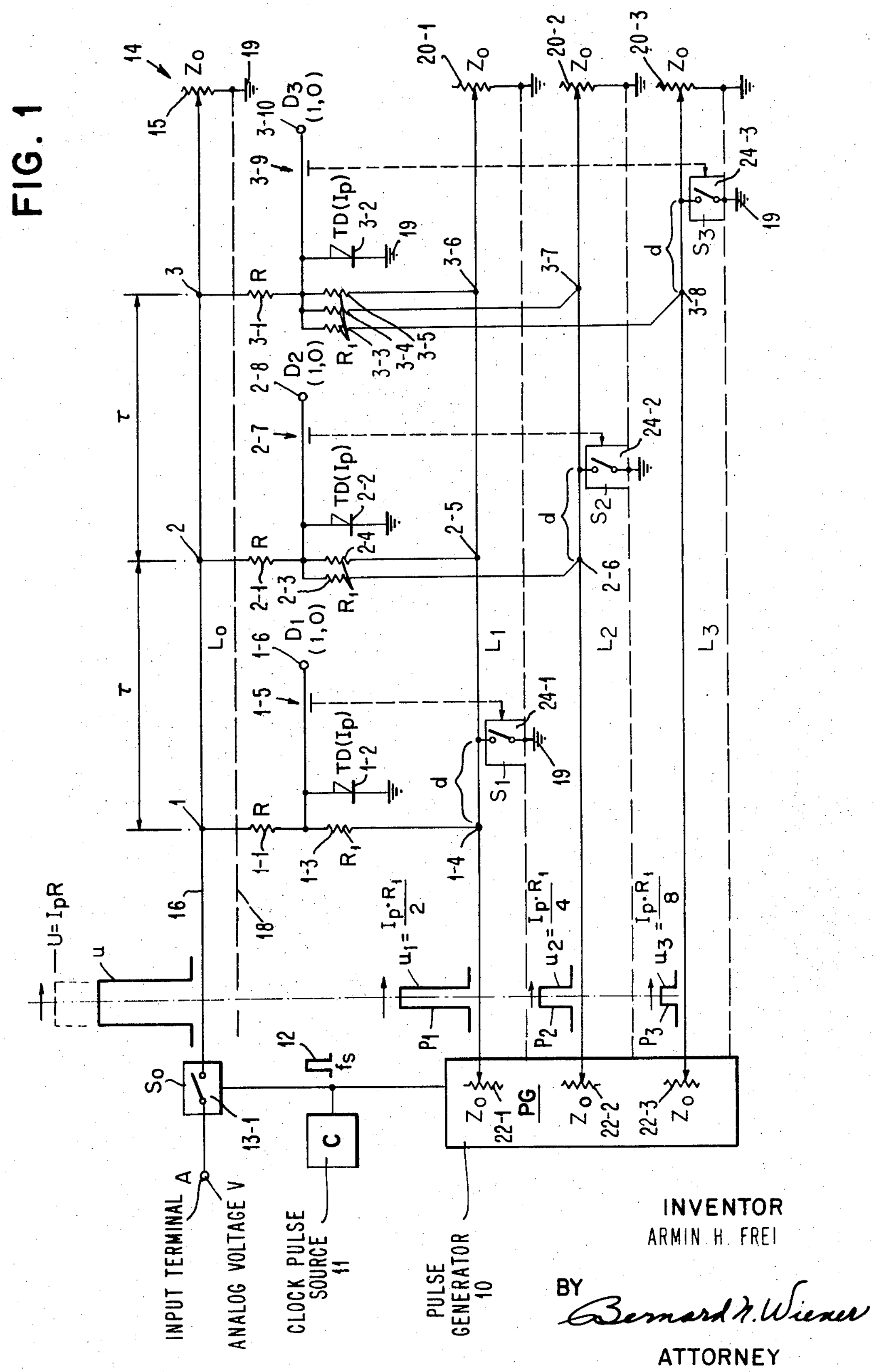
FIG. 1 shows a schematic circuit of the preferred embodiment of the invention.

The embodiment of an analog to digital converter in accordance with this invention shown in FIG. 1 comprises on the left side pulse generating circuitry 10, which is controlled by a clock C indicated by block 11. Its output signals 12 with a pulse frequency $f_s$ are fed to a sampling gate $S_0$ indicated by block 13 and pulse generator PG. The sampling gate $S_0$ connects an input terminal A for analog voltages with a transmission line $L_0$ with upper plane 16 and ground plane 18, the right end 14 of transmission line L is correctly terminated with a load resistor 15 of a value corresponding to the characteristic impedance $Z_0$ of the line. Pulse generator PG is provided with a plurality of outputs, to each of which a respective measuring line is connected. In the schematic representation of FIG. 1, three outputs are shown with their corresponding transmission lines $L_1$, $L_2$ and $L_3$. The latter may be of the same kind as the transmission line $L_0$. Therefore, correct termination with the appropriate line impedance $Z_0$ is provided for at the ends of the line as 20-1, 20-2, and 20-3, and at the generator ends of the lines as 22-1, 22-2 and 22-3, respectively. Each measuring line includes a short-circuiting reflection type switch $S_1$, $S_2$ and $S_3$, respectively, indicated by blocks 24-1, 24-2, and 24-3, respectively. These switches under certain conditions serve the purpose of short circuiting the respective lines in defined places.

Measuring points are provided on line $L_0$ at regular intervals and marked by reference numerals 1, 2 and 3. Points 1 through 3 are marked in the drawing and correspond to measuring lines $L_1$, $L_2$ and $L_3$, respectively. Each measuring point is connected through a respective resistor R labeled 1-1, 2-1 and 3-1 to the anode of a respective tunnel diode TD labeled 1-2, 2-2 and 3-2. All of the cathodes of the tunnel diodes are connected to a common ground. All of the diodes TD are of the same type with a characteristic peak current $I_p$. The number of measuring points utilized depends on the accuracy of the digital representation desired. For each measuring point, a respective measuring line is connected to the pulse generator 10.

One or more other resistors $R_1$ are connected to the anode of each tunnel diode. The number of resistors $R_1$ attached to a tunnel diode corresponds to the ordinal number of the respective tunnel diodes 1-2, 2-2 and 3-2. Thus, there is only one resistor 1-3 connected to the tunnel diode 1-2 related to measuring point 1. The other end of resistor 1-3 is connected to a point 1-4 on transmission line $L_1$ situated at a distance from the beginning of that line at pulse generator 10 such that a pulse needs the same time to reach it as will be needed to reach measuring point 1 on transmission line $L_0$. In relation to measuring point 2 there are two resistors 2-3 and 2-4. One of them is connected between the anode of tunnel diode 2-2 and a point 2-5 on measuring line $L_1$ and the other to the same anode and to a wiring point 2-6 on $L_2$. Both wiring points 2-5 and 2-6 are situated on their respective transmission lines at such a distance from the beginning thereof at pulse generator 10 that pulses reach them in the time as they need to reach measuring point 2. Measuring line $L_1$ bears two connections 1-4 and 2-5 between which the pulse time interval equals the one defined by measuring points 1 and 2 on line $L_0$.

For measuring point 3, the connections of resistors 3-5 and 3-4 to points 3-6 and 3-7 on lines $L_1$ and $L_2$ are similar to connections, 2-5 and 2-6 for lines $L_1$ and $L_2$ for point 2. Additionally, there is a third resistor 3-3 of value $R_1$ which is connected between the anode of tunnel diode 3-2 and a wiring point 3-8 on measuring line $L_3$ which is situated at equal distance in time from the beginning of line $L_3$ as measuring point 3 is separated from the beginning of line $L_0$. Consequently, the wiring points on the measuring lines $L_1$ through $L_3$ are each situated at exactly the same intervals in time as the measuring points on transmission line $L_0$ and the respective transit times are equal on all the lines.

There is a short circuiting switch designated by $S_1$ through $S_3$, respectively, for each measuring line at a given distance after the 1-4, 2-6 and 3-8 wiring point. Each switch is controlled by the voltage present at the anode terminal of the respective tunnel diode 1-2, 2-2 and 3-2 which action is indicated by a dotted line. The anode of each tunnel diode 1-2, 2-2 and 3-2 is connected to the respective terminal $D_1$ through $D_3$ indicated by numbers 1-6, 2-8 and 3-10 where the anode voltage of the tunnel diode can be sensed. In the quiescent state, the potential of all terminals $D_1$ through $D_3$ is zero and the switches $S_1$ through $S_3$ are open. If there is a positive voltage appearing at any terminal $D_1$ through $D_3$, the respective short circuiting switch will close via pick-up 1-5, 2-7 and 3-9, respectively.

The operation of the circuit of FIG. 1 will now be described. An analog voltage V applied to terminal A is sampled by gate $S_o$ under control of clock pulses 12 with the frequency $f_s$ to provide the sampled pulses $u$ to the transmission line $L_o$. These pulses travel along the line $L_o$ with a velocity related to that line and in direction to the right end where their inherent energy is dissipated in the terminating load resistor 15. Also controlled by the same clock pulses 12, the pulse generator PG feeds measuring pulses $u_1$ through $u_3$ to each one of the measuring transmission lines $L_1$ to $L_3$ respectively. Measuring pulses $u_1$ through $u_3$ and analog pulse u travel in synchronism along their respective line to the right end because of the identical transit time on all lines $L_0$ through through $L_3$.

The embodiment of analog to digital converter of this invention shown in FIG. 1 will measure accurately a maximum analog voltage $u_{max} = U = I_p \cdot R$. voltages are not properly converted to the corresponding digital values. Pulse generator PG generates calibrated measuring pulses, i.e., pulses having well defined voltage amplitudes. Illustratively, the first one of these pulses is $u_1 = \frac{1}{2} \cdot I_p R_1$, the second is $u_2 = \frac{1}{4} \cdot I_p \cdot R_1$, and the third is $u_3 = \frac{1}{8} I_p \cdot R_1$. If $n$ measuring points and $n$ measuring lines are used, the $n$-th measuring pulses is $u_n = 1/_2 n \cdot I_p \cdot R_1$. Analog pulse $u$ after having travelled for a time along transmission line $L_0$ reaches measuring point 1. Measuring pulse $u_1$ arrives at the same time at the first wiring point 1-4 of resistor 1-3 on measuring line $L_1$. Both voltages combine so that a current flows through the attached tunnel diode 1-2 which is $u/R + \frac{1}{2} I_p$. If this current exceeds the value of peak current $I_p$, then the tunnel diode 1-2 switches to a higher positive voltage. Sensing of the potential of terminal $D_1$ provides a binary "1". If the peak current value $I_p$ is not reached, the voltage developed across the tunnel diode 1-2 is low which is equivalent to a binary "0".

The control of short circuiting switch $S_1$ on measuring line $L_1$ depends on the first digital value produced. With $D_1$ at a positive voltage level, indicating a binary "1", switch $S_1$ will close as result of pick-up 1-5 so that measuring pulse $u_1$ will undergo total reflection after having participated in generating potential $D_1$. This pulse is not longer available for further measurement. However, switch $S_1$ remains open if a binary "0" appears as the digital output at terminal 1-6 and measuring pulse $u_1$ is still available for further measurement during its movement on line $L_1$. A pulse travels from measuring point 1 to point 2 in a time $\tau$. If a binary "1" has been sensed at terminal $D_1$, the second measuring operation takes place without the presence of pulse $u_1$.

The procedure described is repeated at measuring point 2 although the current through tunnel diode 2-2 has a different value. There are three components of the current through the tunnel diode, i.e., $u/R + (1D_1) I_p/2 = I_p/4$. As binary value $D_1$ can be "1" or "0" only the second term can disappear. Whether tunnel diode 2-2 is switched or not determines whether a binary "1" or a "0" is sensed at terminal $D_2$ and whether short circuiting switch $S_2$ controlled by it is closed or open respectively. If switch $S_2$ is closed, measuring pulse $u_2$ after having participated in the procedure at measuring point 2 is totally reflected and is not present for succeeding measurements.

After a time $\tau$, the pulse $u$ arrives at measuring point 3, where the measuring procedure is repeated to obtain the binary value on output terminal $D_3$. If there has not been a binary "1" before, the current through the tunnel diode 3-2 is made up of four components. For the embodiment of this invention depicted in FIG. 1, this is the last measuring step and the voltage sensed at terminal $D_3$ represents the last digital value. Therefore, the short circuiting switch $S_3$ is not needed for this embodiment of the invention. For higher accuracy or better resolution capacity, more measuring points can be provided along the transmission line $L_0$. For every additional measuring point, a separate measuring transmission line and tunnel diode circuit is needed to obtain the corresponding binary value. The limit of resolution is reached when the last or smallest measured step is in the same order of magnitude as are the tolerances which apply to the operating characteristics of the circuit elements used.

The operating procedure described in accordance with FIG. 1 causes the binary values to be presented at the digital outputs marked D in serial or sequential order of their generation. Due to the switching speed of the tunnel diodes, the digital output signal is delayed very little. These signals appear for the embodiment of FIG. 1 at terminal $D_1$, $D_2$ and $D_3$ within time intervals $\tau$ one after the other. By buffering or otherwise appropriately delaying the first appearing bits, the digital values can be read in parallel order. Such an analog digital converter provided with $n$ measuring points needs a time $(n-1) \cdot \tau$ for presenting all bits of an n-bit digital value. If the clock frequency is $f_s = 1/n \cdot \tau$, and the conversion of a specific analog pulse has ended with the appearance of the $n$th bit, after a time $\tau$, the first bit of the next analog pulse will appear.

The sampling frequency of the analog to digital converter of this invention can be increased so that presentation of digital values of consecutive analog pulses will overlap in time. Illustratively, if the clock frequency is $f_s = 1/\tau$, the last of $n$ bits corresponding to a first analog pulse will appear at the same time as the first bit of analog pulse number $n$ but on a different digital output. In this example, there are $n$ digits presented simultaneously by the analog to digital converter pertaining to the digital presentation of $n$ different analog pulses.

The highest frequency limit for the sampling or clock pulse frequency depends on the rise time of the switching action of short circuiting switches $S_1$ through $S_n$. Switch $S_2$ for instance has to close, i.e., reflect and stop a specific pulse $u_2$ of the measuring pulse sequence each time that digital output $D_2$ shows a binary "1" which has been generated with the contribution thereof. The packing density of measuring pulses $u_2$ can be arbitrarily increased provided that switch $S_2$ is working with appropriate accuracy to reflect a pulse $u_2$ without impairing the following pulses $u_2$. Accordingly, it is important for the switch $S_2$ to be inserted in transmission line $L_2$ at the correct place. Each tunnel diode measuring circuit and the short circuiting switch under its control operate with some time delay. The total delay between arrival of the pulses at measuring point 2 which generate a binary "1" and the short circuit of switch $S_2$ going into effect is taken to be $\tau_R$. Therefore, to reflect a pulse $u_2$ which participated in generating the binary "1" being considered, the insertion point of switch $S_2$ should be chosen distant from measuring point 2 by a transit time equal to $\tau_R$. To avoid critical conditions, the length of the switching function, i.e., the duration of the short-circuit, can be increased.

The reflected pulse from a shorting switch travels along the respective transmission line toward the pulse generator PG. Illustratively, reflected pulse $u_2$ passes measuring point 2 on its return travel a second time. Time coincidence of forward and backward travelling pulses at a measuring point must be excluded because an erroneous digital signal would result. The proper condition is for $2 \cdot \tau_R \neq (m/f_s)$, where m is an optional integer. Further, delay $\tau_R$ of the short circuit should not be longer than the transit time, $\tau_R \leq \tau$, of pulses from one measuring point to the next, as the short-circuit of switch $S_2$ must prevent a specific pulse $u_2$ from reaching the following measuring points when $D_2$ presents a binary "1".

The following considerations are of significance for an embodiment of an analog digital converter of this invention. Resistors R and $R_1$ attached to measuring and wiring points load the respective transmission line. Therefore, their value must be high with respect to the characteristic impedance $Z_0$ of the transmission line so that the pulses $u$, $u_1$, $u_2$ and $u_3$ do not lose significant energy along the respective transmission line and reflections effectively do not occur at measuring points. Homogeneity of the transmission lines can be achieved by selected loading. Pulse voltages along the lines can be kept constant by appropriately tapering the lines so accuracy of the converter is not diminished.

To minimize deterioration of the quality of the analog to digital conversion, switches $S_1$, $S_2$ and $S_3$ should present an electrical resistance which is smaller than the characteristic impedance of the respective line by a factor of $2^n$. The present analog digital converter requires only relative precision for an analog to digital performing conversion in contrast to the prior art devices which also require absolute precision. Illustratively, the short circuiting switches $S_1$, $S_2$ and $S_3$ may be Schottky-barrier-diodes.

The properties of the transmission lines $L_0$ through $L_n$ will also influence the quality of the analog to digital conversion. The types of lines known as microstrips are especially suitable for the transmission lines $L_0$ through $L_n$. Radiation losses for the transmission lines can be equalized by connecting properly chosen resistors R and $R_1$. For the same purpose compensation is obtainable by appropriately setting the peak current of the tunnel diode.

The packing density in an electronic device plays an important role in modern technical applications. The present analog digital converter can be built in very little space due to the relative simplicity of the circuitry.

Figure 2:
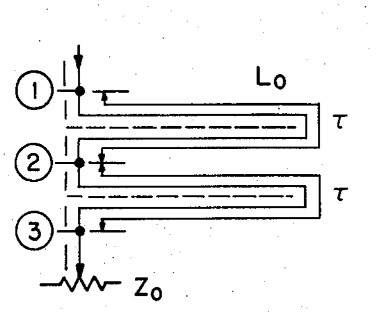
FIG. 2 illustrates how the line sections of $L_0$ are folded to concentrate the measuring points 1 through 3 of FIG. 1.

As shown in FIG. 2, measuring points 1 through n can be brought very close together by folding the transmission lines, and as a consequence the tunnel diode measuring circuits are also close one to each other. Therefore, this analog to digital converter is suitable for a module in integrated circuit technique. The stacking of all $n+1$ transmission lines and the use of integrated circuits is desirable for an embodiment of this converter for an exceptionally small space.

Figure 3:
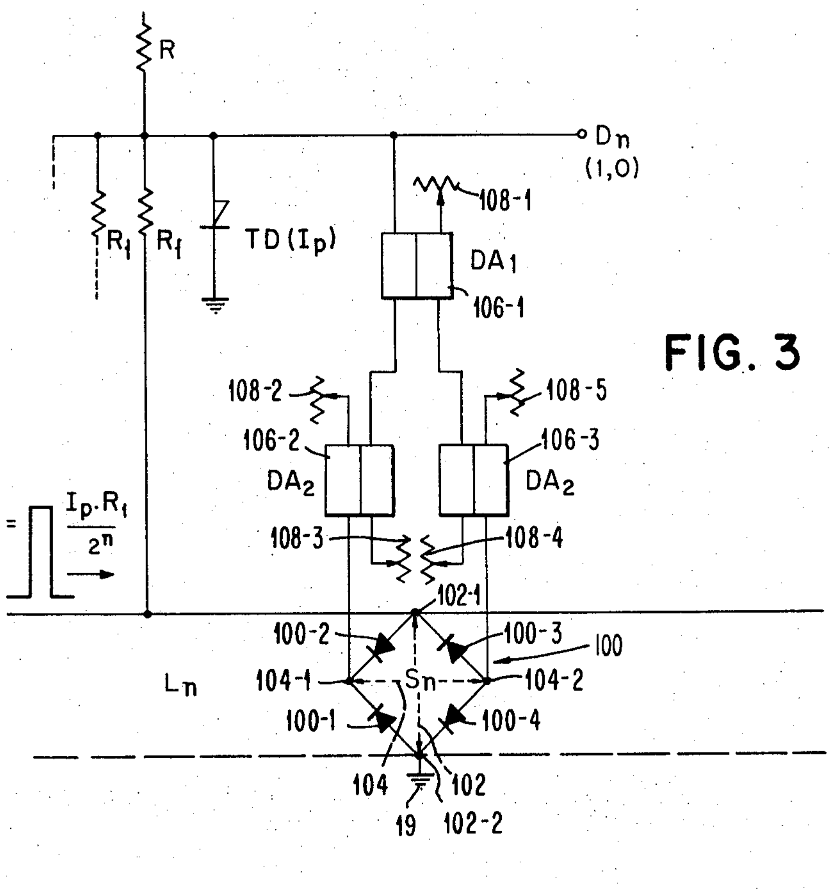
FIG. 3 is a schematic representation of a short circuiting reflection type switch used with the measuring lines and the appropriate control circuitry for the practice of this invention.

FIG. 3 shows a schematic diagram of a short circuiting switch suitable for use with a measuring line $L_n$. The switch is formed by a bridge circuit 100 comprising four Schottky-barrier diodes 100-1, 100-2, 100-3 and 100-4, one diagonal 102 of which is connected across the line between points 102-1 and 102-2 and effects a short-circuit when carrying current. The diode bridge circuit is under control of the tunnel diode TD anode voltage which is amplified in distributed amplifiers $DA_1$, $DA_2$ and $DA_3$ indicated by the numerals 106-1, 106-2 and 106-3, respectively. Resistors 108-1 to 108-5 are matched terminations of the distributed amplifiers. The output signals of these amplifiers are fed to the second diagonal 104 of the bridge circuit between points 104-1 and 104-2. The distributed amplifiers are cascaded in two steps to transform the data signal present on terminal $D_n$ into a symmetrical control voltage for the bridge circuit 100 of switch $S_n$. The first amplifier $DA_1$ functions as a phase splitter and does not contribute significant amplifying action. The amplifying action is primarily effected by the amplifiers $DA_2$ which mutually bring the signal to the level required for control of the diode bridge 100. Additionally, the total reaction time for tunnel diode, amplifier and switch should be less than or equal to transit time $\tau$.

For the embodiment of the analog digital converter of this invention shown in FIG. 1, a static hold or storing function is not included. A considerable flow of information can be processed due to temporary dynamic storage using transmission lines. The conversion procedure is continuous and operates at high speed. All signals in the converter are desirably processed in circuits using only passive elements or fast-switching semiconductors so that delays are minimized. The quality of the present analog digital converter is not impaired by pulse overshoot because neither the analog nor the measuring pulses are fed through amplifiers, feedback circuits or impedance devices. The measuring pulses can be readily derived from one generator or directly from the clock pulse source and brought to the desired level by use of attenuators. In addition, unwanted reflections on the transmission lines are avoided by proper termination and compensation for any inhomogeneity.

The analog to digital converter of this invention is specially suitable for operational requirements of high quality and high accuracy conversion. Additionally, the stability of the operating conditions results in high resolution capacity, i.e., there is a high rate of bits per analog sample. The simplicity of the circuit and its layout permit the manufacture of a compact embodiment at exceptionally low cost.

While the invention has been particularly shown and described with reference to the preferred embodiment thereof, it will be understood by those skilled in the art that the foregoing and other changes in form and details may be made therein without departing from the spirit and scope of the invention.

What is claimed is:

1. An analog to digital converter for providing a digital representation of analog signals having no greater than a predetermined maximum amplitude, comprising in combination:

analog signal sampling means:

a plurality of $n$ measuring circuits ordered from 1 to $n$ corresponding to n respective digit positions of said digital representation each said measuring circuit having an output terminal;

input means including delay means connected to said n measuring circuits for sequentially applying said analog signal sample to be measured to each said measuring circuit in a given time sequence which corresponds to the time sequence of the digital representation of each analog signal sample, the digital bit rate of said time sequence being $n$ times the analog signal sample rate;

reference signal source means for providing a plurality of $n$ different measuring pulse amplitudes ordered from 1 to n, wherein the greatest measuring pulse amplitude is smaller than said predetermined maximum amplitude of the analog signals to be measured and each further measuring pulse amplitude is successively smaller, each said measuring pulse amplitude being successively related to each other and to said predetermined maximum amplitude of said analog signals by a multiplicative factor of two;

a plurality of n transmission means, ordered from 1 to $n$, connecting said reference signal source and said measuring circuits such that, a first of said $n$ measuring pulse amplitudes is sequentially applied to each of said measuring circuits in accordance with said given time sequence, a second of said $n$ measuring pulse amplitudes is sequentially applied to each of said measuring circuits, other than the first, in accordance with said given time sequence, and the remainder of said measuring pulse amplitudes are in like manner sequentially applied to succeedingly lesser numbers of said measuring circuits whereby the $n$th measuring pulse amplitude is only applied to said $n$th measuring circuit;

each said measuring circuit producing a digital output signal of one or the other binary value if the sum of the analog signal sample and the measuring pulse amplitudes applied thereto exceeds or fails to exceed, respectively, a given threshold, and a plurality of n reference signal inhibiting means, ordered from 1 to $n$, each being connected to an associated measuring circuit and only an associated one of said plurality of transmission means corresponding to said ordinal number, each inhibiting means being responsive to a one of the binary output signal values from its associated measuring circuit to inhibit further application of the particular measuring pulse amplitude applied thereto to succeeding ones of said measuring circuits, said inhibiting means being nonresponsive to the other of said binary output signal values from its associated measuring circuit thereby permitting further applications of the particular measuring pulse amplitude applied thereto to succeeding ones of said measuring circuits, whereby a digital representation of the analog signal sample is obtained in sequence at said measuring circuits output terminals as a result of successive measurements in said given time sequence.

2. An analog to digital converter as set forth in claim 1 wherein said input means comprises a transmission line having n taps ordered from 1 to *n* and a different one of said measuring circuits is connected to a different one of said taps.

3. An analog to digital converter as set forth in claim 1 wherein said plurality of *n* transmission means comprises a plurality of transmission lines ordered from 1 to *n*, each terminated with an appropriate impedance; and each said inhibiting means comprises a switching circuit for short circuiting a particular one of said transmission lines in accordance with its associated ordinal number.

4. The analog to digital converter as set forth in claim 3 wherein each said measuring circuit includes a tunnel diode.

5. The analog to digital converter as set forth in claim 4 wherein said reference signal source means includes a pulse generator for providing a series of pulses of given frequency.

6. The analogy to digital converter as set forth in 5, wherein said analog signal sample means is connected to said input transmission line and an analog signal input line for providing said analog amplitude of given parameter to be measured by said converter.

7. The analog to digital converter as set forth in claim 6 wherein said signal sampling means is further connected to and under control of said pulse generator.

* * * * *